United States Patent [19]

Krutenat

[11] 3,930,901

[45] Jan. 6, 1976

[54] COATING INGOT PRETREATMENT

[75] Inventor: Richard C. Krutenat, Richland, Wash.

[73] Assignee: United Technologies Corporation, Hartford, Conn.

[22] Filed: Jan. 6, 1975

[21] Appl. No.: 538,611

[52] U.S. Cl. .................. 148/13; 148/126; 148/133; 148/134

[51] Int. Cl.² ........................................... C22F 1/02

[58] Field of Search ......... 148/13, 1, 4, 126, 3, 133, 148/134; 75/171; 264/111

[56] References Cited

UNITED STATES PATENTS 3,676,085   7/1972   Evans et al. ........................ 75/171

*Primary Examiner*—R. Dean
*Attorney, Agent, or Firm*—Richard N. James

[57] ABSTRACT

A compacted powder or extended ingot for use in the deposition of coatings consisting essentially of a cobalt-base alloy containing chromium, aluminum and yttrium is vacuum heat treated to convert any alumina present therein to aluminum and yttria.

6 Claims, No Drawings

COATING INGOT PRETREATMENT

BACKGROUND OF THE INVENTION

The present invention relates to the coating arts, particularly those wherein the coating is formed by vacuum vapor deposition.

The oxidation and sulfidation erosion resistance of the nickel-base and cobalt-base superalloys may be markedly increased through the use of a coating thereover which consists essentially of a cobalt alloy containing chromium, aluminum and yttrium particularly at the composition, by weight, of 15–40 percent chromium, 10–25 percent aluminum, 0.01–5 percent yttrium, balance cobalt (CoCrAlY). This coating alloy is discussed in detail in the U.S. Pat. No. 3,676,085, of common assignee herewith, and whose teachings are incorporated herein by reference.

The most common way of generating the coatings is by vacuum vapor deposition. The surfaces to be coated are cleaned free of dirt and other objectionable foreign matter and are conditioned by abrasive blasting. The coating is achieved by vapor deposition from a molten pool of the coating material held in a vacuum chamber at $10^{-4}$ ton or better. The ingot being melted to form the molten pool has essentially the same chemistry as that of the desired coating. Melting may be accomplished by electron beam heating. The vapors generated are deposited on the surfaces to be coated in the chamber.

One of the problems uncovered in the deposition process has been that oxide inclusions, such as alumina, formed in the formation of the coating ingot rise to the surface of the molten pool during ingot evaporation. Because of the low thermal conductivity of these oxides they become superheated by electron bombardment. A layer of vapor then develops beneath each floating particle causing a depression in the liquid surface. If the liquid then closes around the cavity thus created, an eruption of liquid occurs, ejecting small droplets of liquid from the surface. The net result is the formation of pin holes or droplets on the coating, causing rejection of the part.

The onset of spitting is related to the power supplied to the system and is one of the chief limitations to high evaporation rates.

SUMMARY OF THE INVENTION

The present invention contemplates a coating alloy ingot pretreatment wherein non-volatile oxides, such as alumina, are converted to other more volatile oxides such as yttria, whereby the spitting encountered in the generation of coatings by vacuum vapor deposition is minimized.

In a particular embodiment of the invention, an ingot formed from an alloy consisting of cobalt, chromium, aluminum and yttrium is vacuum heat treated to effect conversion of any alumina present to aluminum plus yttria, the yttria subliming more readily than the alumina.

In another embodiment of the invention, in systems where spitting is encountered in the evaporation of metals or alloys due to non-volatile oxide inclusions, yttrium is doped into the ingot during fabrication and the consolidated ingot is heat treated in vacuum to convert the non-volatile oxide to yttria by a displacement reaction in the solid phase.

DESCRIPTION OF THE PREFERRED EMBODIMENTS

A heat of two ingots of a CoCrAlY composition were received. One as-received powder compacted ingot was found to spit unacceptably in a vacuum vapor deposition coating operation. The spitting, as previously explained, was discovered to result from the presence of a layer of alumina covering the surface of the melt.

The second ingot from the same heat was heat treated by holding at 2000°F. in vacuum for 16 hours. This heat treatment caused a solid state displacement reaction between the non-volatile alumina inclusions and yttrium to form metallic aluminum and yttria.

The advantage of the yttria resides in the fact that it sublimes more readily than alumina and other less volatile refracting oxides. Accordingly, the yttria formed as a result of the heat treatment is readily evaporated along with the melt and no spitting eruptions are encountered during coating. The ingot, heat treated at 2000°F. for 16 hours, displayed excellent behavior and exhibited no spitting during vacuum vapor deposition.

The above heat treatment involving the displacement reaction was effected while maintaining the composition in the solid state. In such a treatment, a small grain size in the ingot is utilized to minimize the length of the diffusion path required for the solid state reaction to occur.

Although the invention has been described in connection with the CoCrAlY coating system, where yttrium is present, it is, of course, applicable to other alloy systems as well in environments or processes where spitting is a problem. Where spitting results from the presence of non-volatile oxides on the surface of a melt, the composition may be doped with yttrium. The yttrium would typically be doped into the alloy prior to formation of the powders for the ingot. The compacted powder ingot would then be heat treated to convert the less stable detrimental oxide to the elementary metal and yttria by exposure for a time and temperature sufficient to effect the displacement reaction in the solid state.

What is claimed is:

1. The method of pretreating a vacuum vapor deposition coating alloy ingot formed from a cobalt-base alloy containing aluminum and yttrium together with alumina inclusions which comprises:
    heat treating the ingot in vacuum for a time and at a temperature sufficient to substantially convert the alumina to yttria and aluminum whereby the spitting propensity of the ingot is reduced.

2. The method according to claim 1 wherein:
    the ingot comprises fine compacted powders.

3. The method of pretreating a fine compacted powder ingot formed of a cobalt alloy containing about 15–40 weight percent chromium, 10–25 weight percent aluminum, 0.01–5 percent yttrium and alumina inclusions which comprises:
    heat treating the ingot in vacuum for a time and at a temperature to substantially convert the alumina to yttria and aluminum.

4. The method according to claim 3 wherein:
    the treatment is conducted at a temperature not less than about 2000°F.

5. The method according to claim 4 wherein:
    the treatment is conducted at a temperature of about 2000°F. for about 16 hours.

6. The method of pretreating a coating alloy ingot containing alumina inclusions which lead to unacceptable spitting in the coating processes involving vacuum vapor deposition which comprises:
  including elemental yttrium in the coating alloy; and
  heat treating the ingot in a time/temperature treatment in vacuum sufficient to substantially convert the alumina to aluminum and yttria.

* * * * *